United States Patent
Ono et al.

[11] Patent Number: 5,404,140
[45] Date of Patent: Apr. 4, 1995

[54] CODING SYSTEM

[75] Inventors: Fumitaka Ono; Tomohiro Kimura; Masayuki Yoshida; Shigenori Kino, all of Kanagawa, Japan

[73] Assignee: Mitsubishi Denki Kabushiki Kaisha, Tokyo, Japan

[21] Appl. No.: 180,644

[22] Filed: Jan. 13, 1994

Related U.S. Application Data

[63] Continuation of Ser. No. 990,377, Dec. 15, 1992, which is a continuation of Ser. No. 660,583, Feb. 25, 1991, abandoned.

[30] Foreign Application Priority Data

Feb. 26, 1990 [JP] Japan .................. 2-46275

[51] Int. Cl.⁶ ............................................. H03M 7/34
[52] U.S. Cl. ............................................ 341/107; 341/51
[58] Field of Search ............. 341/107, 106, 109, 51

[56] References Cited

U.S. PATENT DOCUMENTS 4,191,974  3/1980  Ono et al. .
5,057,917 10/1991  Shalkauser ............... 358/135
5,059,976 10/1991  Ono et al. ................. 341/107 X

FOREIGN PATENT DOCUMENTS 0381078 8/1990 Japan .

OTHER PUBLICATIONS

W. B. Pennebaker, J. L. Mitchell, G. G. Langdon, Jr. R. B. Arps, "An Overview of the Basic Principles of the Q-Coder Adaptive Binary Arithmetic Coder," pp. 717-726, IBM J. Res. Develop. vol. 32, No. 6, Nov. 1988.

*Primary Examiner*—Sharon D. Logan
*Attorney, Agent, or Firm*—Wolf, Greenfield & Sacks

[57] ABSTRACT

A coding system comprises the comparing circuit which compares a magnitude of the range on the number line which is allocated to the most probability symbol with a magnitude of the fixed range on the number line which is allocated to the Less Probability Symbol. If the range allocated to the MPS is smaller than that to the LPS, and when the symbol is the MPS, the range allocated to the LPS is generated. If the range allocated to the MPS is smaller than that to the LPS, and when the symbol is the LPS, the range allocated to the MPS is generated. By the system, a coding efficiency is improved especially when a probability of occurrence of LPS (Less Probability Symbol) is approximate to ½.

9 Claims, 5 Drawing Sheets

CODING SYSTEM

This is a continuation of Ser. No. 990,377, filed Dec. 15, 1992, which is a continuation of Ser. No. 660,583, filed Feb. 25, 1991, now abandoned.

BACKGROUND OF THE INVENTION

The present invention is directed to a system for coding image information or the like.

A coding system for a Markov information source is known as a number line representation coding system for coding the information source by mapping a symbol sequence on a number line from 0.0 to 1.0 and using the binary-represented coordinates as code words.

FIG. 1 is a chart showing a concept of the system described above. For simplicity, a binary information source is that is memoryless and wherein r is the probability of occurrence of a symbol "1", and $1-r$ is the probability of occurrence of a symbol "0". If a length of a sequence of the memoryless source is set to 3, respective coordinates of C(000)-C(111) are binary-represented at the right. The binary representation is stopped up to distinguishable digits to provide code words. With this arrangement, decoding is attainable on the receiving side by passing through the same processes as those on the transmitting side.

In such a sequence, a mapping range Ai on the number line of the symbol sequence at the i-th point and minimum coordinates $C_i$ are expressed as the following: when the output symbol $a_i$ is 0:

$$A_i = (1-r)A_{i-1}$$

$$C_i = C_{i-1} + rA_{i-1}$$

and when the output symbol $a_i$ is 1, they are expressed as follow:

$$A_i = rA_{i-1}$$

$$C_i = C_{i-1}$$

Now, as stated in "An Overview of the Basic Principles of the Q-Coder-Adaptive Binary Arithmetic Coder" (IBM Journal of Research & Development Vol. 32, No. 6, Nov. 1988), $rA_{i-1}$ is not necessarily calculated to reduce the number of arithmetic operations such as multiplications. Instead, there is adopted a system for selecting a certain value corresponding to a Markov status from a table containing a plurality of fixed values.

When the symbols are sequentially and repeatedly output the range $A_{i-1}$ gradually narrows. To keep an arithmetic accuracy, normalization is required ($A_{i-1}$ is multiplied to a power of 2). According to this normalization, as a matter of course, the fixed values perpetually remain as they are in the code words. Processing is effected by executing a shift of a binary number, i.e., 1/(power of 2) during the arithmetic operation.

If $rA_{i-1}$ is herein replaced with S, the above-described formulae are expressed as with when $a_i$ is 0:

$$A_i = A_{i-1} - S$$

$$C_i = C_{i-1} + S$$

and when $a_i$ is 1 as follows with $$A_i = S$$

$$C_i = C_{i-1}$$

The symbol range $A_{i-1}$ gradually narrows with an increment in symbols. It is therefore required that S be gradually decreased as the symbols increase. S can be decreased concretely by performing the shift of 1/(power of 2). Alternatively, the range $A_{i-1}$ is multiplied to the power of 2 on the number line, and it can be considered to employ the constant value S. This is referred to as normalization.

Note that, if the symbol $a_i$ is 0, this is called MPS (More Probability Symbol: symbol having a higher probability of occurrence). Whereas, if $a_i$ is 1, this is called LPS (Less Probability Symbol: symbol having a lower probability of occurrence). The MPS implies that the probability of occurrence is presumably high while a predict converting process is effected beforehand. The LPS implies that the probability is presumably low.

When the symbol $a_i$ is "1", the range $A_i$, which is expressed as $A_i = rA_{i-1} = S$, is conceived as a range of the LPS.

FIG. 2 is a block diagram depicting a conventional coding system. Referring to FIG. 2, the numeral 1 designates a register for temporarily storing values of a range allocated to the previous symbol; 2 a subtracter; 3 a changeover unit for changing over the range; 5 a changeover unit for changing over the coordinates; 6 a shifter for determining a shift quantity in the normalization; and 7 an arithmetic unit for computing a coding output.

Next, the operation will be described with reference to the drawings.

Outputted from an unillustrated prediction estimating unit to the subtracter 2 is S (a Less Probability Symbol range) selected from a table containing the plurality of values on the basis of a status of the Markov information source. The subtracter 2 obtains a difference $A_{i-1} - S$ between the range S and the previous symbol range $A_{i-1}$ stored in the register 1. The subtracter 2 then outputs this difference. Inputted to the changeover unit 3 are the range $A_{i-1} - S$ allocated to the MPS and the range S allocated to the LPS. The changeover unit 3 changes over a range $A_i$ allocated to the symbol, depending on whether the symbol comes under the MPS or the LPS. More specifically, if the symbol is defined as the MPS, the changeover unit 3 produces an output as a range equal to $A_{i-1} - S$, which is allocated to the symbol. Whereas, if the symbol is the LPS, the changeover unit 3 gives forth the output as a range $A_i = S$, which is allocated to the symbol.

Depending on whether the symbol comes under the MPS or the LPS, a changeover unit 5 outputs either the LPS symbol range S or a fixed value "0" as differential coordinates $\Delta C$ with respect to the minimum coordinates $C_{i-1}$ of the range $A_{i-1}$ allocated to the previous symbol. Namely, the changeover unit 5 gives an output as differential coordinates $\Delta C = S$, if the symbol is the MPS. If the symbol is the LPS, the unit 5 gives the output as differential coordinates $\Delta C = 0$.

An output $A_i$ of the changeover unit 3 is sent to the register 1, the shifter 6 and the arithmetic unit 7.

A range $A_i$ allocated to a symbol $a_i$ is stored in the register 1. The range $A_i$ becomes data for calculating the next symbol range. The shifter 6 compares the range $A_i$ with $\frac{1}{2}$. If it is smaller than $\frac{1}{2}$, the range $A_i$ is doubled. Thereafter, the doubled value is compared with $\frac{1}{2}$ once again. The comparison is repeated until the range $A_i$ exceeds ½. The power number 1 is outputted as a shift quantity 1 of the coordinates to the arithmetic unit 7 corresponding to the shifts to make $A_i$ exceed ½. The arithmetic unit 7 computes and outputs the code words upon receiving outputs from the changeover units 3 and 5 and the shifter 6. The differential coordinates, which have cumulatively been added from the past, are stored in the arithmetic unit 7. The values cumulatively added by the arithmetic unit 7 are equal to the minimum coordinates $C_{i-1}$ of the range allocated to the previous symbol. The arithmetic unit 7 adds the input differential coordinates $\Delta C$ to the minimum coordinates $C_{1-1}$ of the previous symbol, thereby obtaining the minimum coordinates $C_i$ of a range allocated to the present symbol. Subsequently, the arithmetic unit 7 examines whether or not there exists a coincident portion between a portion shifted by a shift quantity 1 (bits) of the minimum coordinates $C_i$ and a portion resultantly obtained by adding the range $A_i$ to the minimum coordinates C. If the coincident portion exists, this portion is outputted as definitely determined coordinate bits, i.e., code words.

As discussed above, when using a constant value as S, particularly the LPS range S is large. This presents a problem if the previous symbol range $A_{i-1}$ which has been normalization-represented is relatively small.

This will be exemplified as follows. Now supposing that the range $A_{i-1}$ allocated to the previous symbol $a_{i-1}$ slightly exceeds 0.5, the symbol range $A_i$ when the symbol $a_i$ is the MPS becomes rather small. Sometimes, this symbol range $A_i$ is far smaller than $A_i$ when the symbol $a_i$ is the LPS. Namely, instead of the fact that the probability of occurrence in the MPS is originally higher than in the LPS, it follows that the range allocated to the MPS becomes smaller than the range allocated to the LPS. This leads to a decline of coding efficiency due to longer average code words. Provided that the range allocated to the MPS is invariably larger than the range allocated to the LPS, S is required to be smaller than 0.25. This is because $A_{i-1} > 0.5$.

Hence, when the previous symbol range $A_{i-1}$ is 1.0, r $=0.25$. When the previous symbol range $A_{i-1}$ is approximate to 0.5, $r=0.5$. For this reason, the probability of occurrence eventually fluctuates between ¼ and ½ in terms of coding.

If this fluctuation width is reduced, the range allocation proportional to the probability of occurrence can be made. Therefore, an improvement of the coding efficiency can be expected.

SUMMARY OF THE INVENTION

The present invention, which has been devised to obviate the foregoing problems, aims at improving a coding efficiency especially when a probability of occurrence of the LPS (Less Probability Symbol) is approximate to ½.

To accomplish this object, according to one aspect of the invention, there is provided a coding system arranged such that: a symbol sequence of a Markov information source is caused to correspond to a certain range on a number line; a transmission is effected by use of binary-represented values of information of positions on the number line; and a coding compression is thus performed, characterized by comprising: a subtracting means for generating a constant range S selected and inputted corresponding to a probability of occurrence of a symbol when the symbol is a Less Probability Symbol and also generating a range obtained by subtracting the constant range S from a predetermined range when the symbol is a More Probability Symbol (having a higher frequency of occurrence); and a comparing means for comparing a magnitude of the constant value S with that of an output of the subtracting means, whereby the range allocation onto the number line is effected by temporarily replacing an interpretation of the More Probability Symbol with that of the Less Probability Symbol on the transmitting/receiving sides when the range given to the More Probability Symbol is smaller than the range given to the Less Probability Symbol.

According to the coding system of this invention, the comparing means compares a magnitude of the range on the number line which is allocated to the most probability symbol with a magnitude of the range on the number line which is allocated to the Less Probability Symbol. If the range allocated to the MPS is smaller than that to the LPS, and if the symbol is the MPS, the range allocated to the LPS is generated. If the range allocated to the MPS is smaller than that to the LPS, and if the symbol is the LPS, the range allocated to the MPS is generated.

BRIEF DESCRIPTION OF THE DRAWINGS

Other objects and advantages of the present invention will become apparent during the following discussion taken in conjunction with the accompanying drawings, in which.

DETAILED DESCRIPTION OF THE PREFERRED EMBODIMENTS

Figure 1:
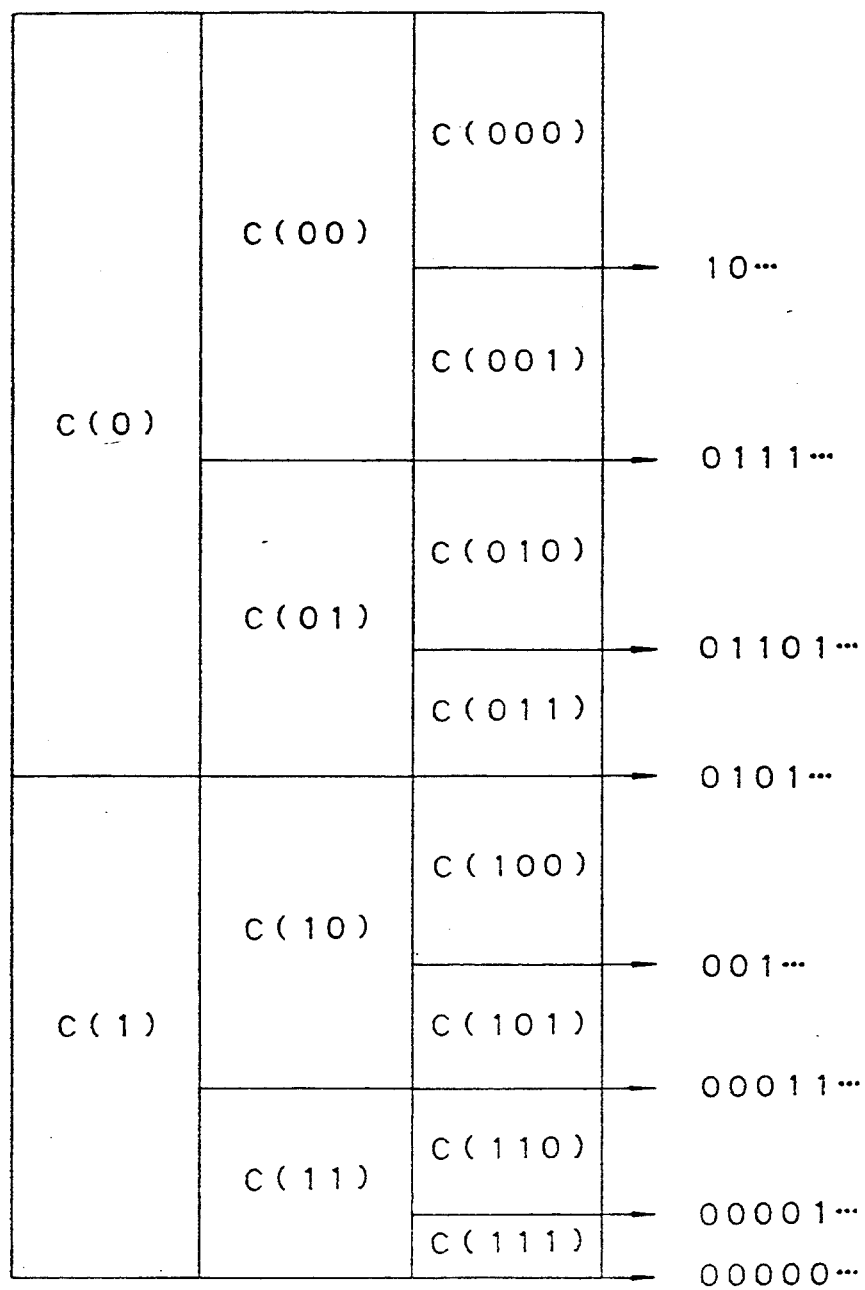
FIG. 1 is a chart showing a concept of a coding system.
Figure 2:
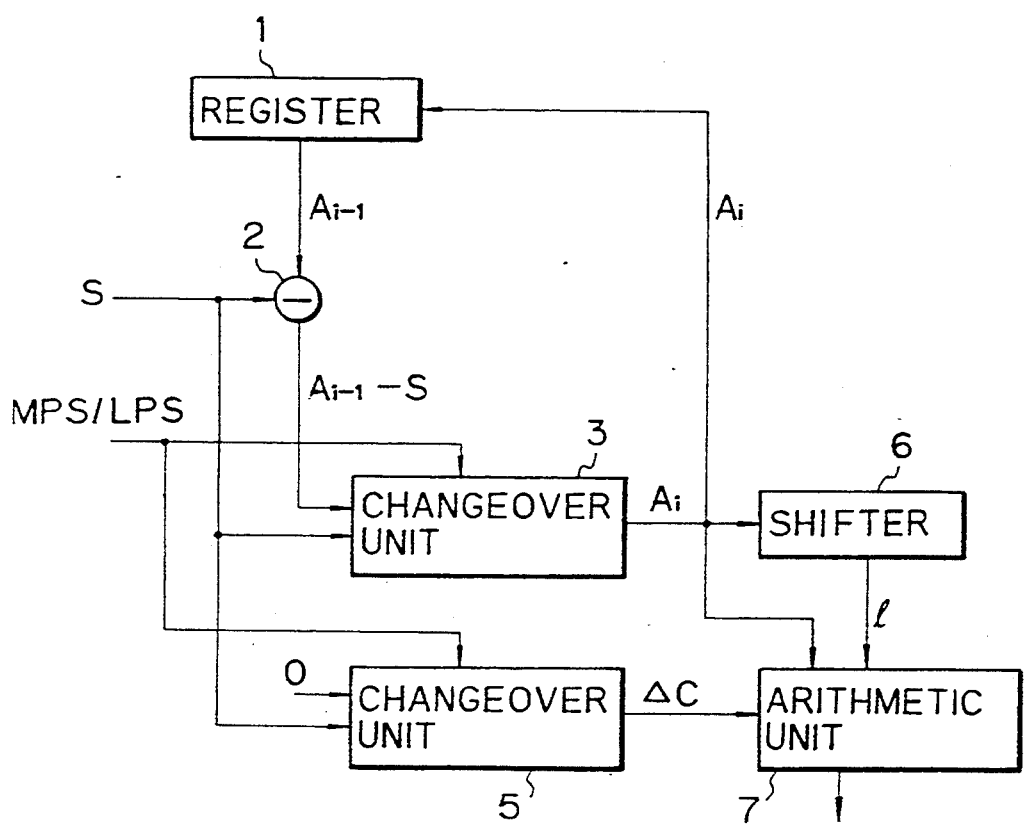
FIG. 2 is a block diagram depicting a conventional coding system.
Figure 3:
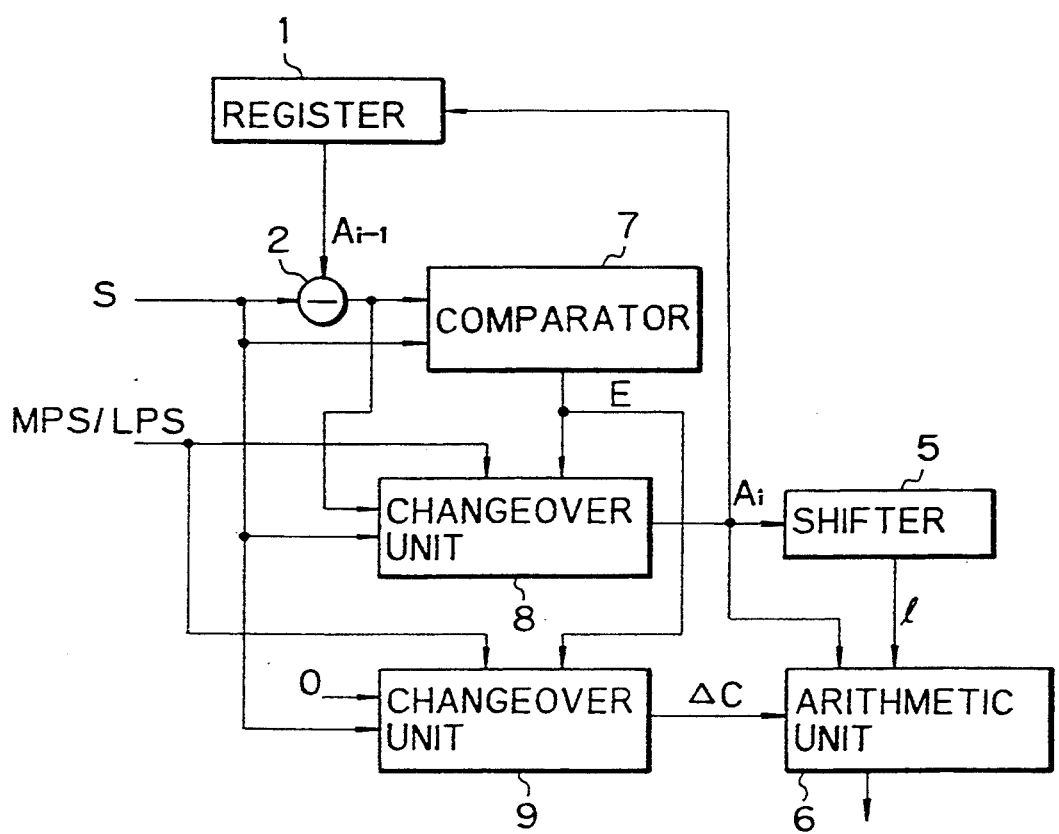
FIG. 3 is a block diagram illustrating a coding system in one embodiment of this invention.

The present invention will hereinafter be described by way of one embodiment with reference to the accompanying drawings. Referring to FIG. 3, the numeral 1 denotes a register for holding a range $A_i$ of a previous symbol; 2 a subtracter; 8 a changeover unit; 9 a changeover unit; 5 a shifter; 6 an arithmetic unit; and 7 a comparator.

Next, the operation will be explained referring to FIG. 3.

Outputted from prediction estimating unit 11 to the subtracter 2 is S (a Less Probability Symbol range) from a table stored in a memory 12 containing a plurality of values on the basis of a status of a Markov information source. The subtracter 2 obtains a difference $A_{i-1} - S$ between the range S and a previous symbol range $A_{i-1}$ stored in the register 1. The subtracter 2 then outputs this difference. The comparator 7 compares a magnitude of the difference $A_{i-1} - S$ with a magnitude of the Less Probability Symbol range S inputted directly from the prediction estimating unit. A result E thereof is outputted.

On the other hand, the changeover unit 8 outputs either $A_{i-1} - S$ or S as a value of the range to the present symbol. This outputting process is effected based on the difference $A_{i-1} - S$ inputted from the subtracter 2, the output E of the comparator 7, which is inputted from the prediction estimating unit, and a signal MPS/LPS inputted from the prediction estimating unit, the signal indicating whether the Markov information source is in the More Probability Symbol or the Less Probability Symbol.

To be more specific, the output E of the comparator 7 is set to "1" when $A_{i-1} - S > S$. When $A_{i-1} - S \leq S$, the output E is set to "0". Based on this presumption:

(a) When $E=1$, and when the symbol $a_i=0$ (MPS), the changeover unit 8 outputs $A_{i-1} - S$ as a range allocated to the symbol $a_i$;

(b) When $E=1$, and when the symbol $a_i=1$ (LPS), the changeover unit 8 outputs S as a range allocated to the symbol $a_i$;

(c) When $E=0$, and when the symbol $a_i=0$ (MPS), the changeover unit 8 outputs S as a range allocated to the symbol $a_i$; and (d) When $E=0$, and when the symbol $a_i=1$ (LPS), the changeover unit 8 outputs $A_{i-1} - S$ as a range allocated to the symbol $a_i$. The changeover unit 9 outputs either the S inputted from the prediction estimating unit or the fixed valve "0" (as coordinates $\Delta C$ of the difference with respect to the minimum coordinates of the range allocated to the previous symbol $a_{i-1}$) on the basis of the signal E from the comparator 7 and the symbol $a_i$. Namely:

(a) When $E=1$, and when the symbol $a_i=0$ (MPS), the changeover unit 9 outputs the fixed input S (as coordinates $\Delta C = S$ of the difference between the minimum coordinates $C_{i-1}$ of the range of the previous symbol $A_{i-1}$ and the range of the least coordinates $C_i$ of the range of the symbol $a_i$);

(b) When $E=1$, and when the symbol $a_i=1$ (LPS), the changeover unit 9 outputs value "0" (as coordinates $\Delta C = 0$ of the difference between the minimum coordinates $C_{i-1}$ of the range of the previous symbol $a_{i-1}$ and the minimum coordinates $C_i$ of the range of the symbol $a_i$);

(c) When $E=0$, and when the symbol $a_i=0$ (MPS), the changeover unit 9 outputs the fixed output 0 (as the difference coordinates $\Delta C = 0$); and (d) When $E=0$, and when the symbol $a_i=1$ (LPS), the changeover unit 9 outputs the input S (as the difference coordinates $\Delta C = S$). An output $A_i$ of the changeover unit 8 is transmitted to the register 1, the shifter 5 and the arithmetic unit 6.

The operations of the shifter 5 and the arithmetic unit 6 are the same as those in the prior art.

Figure 4:
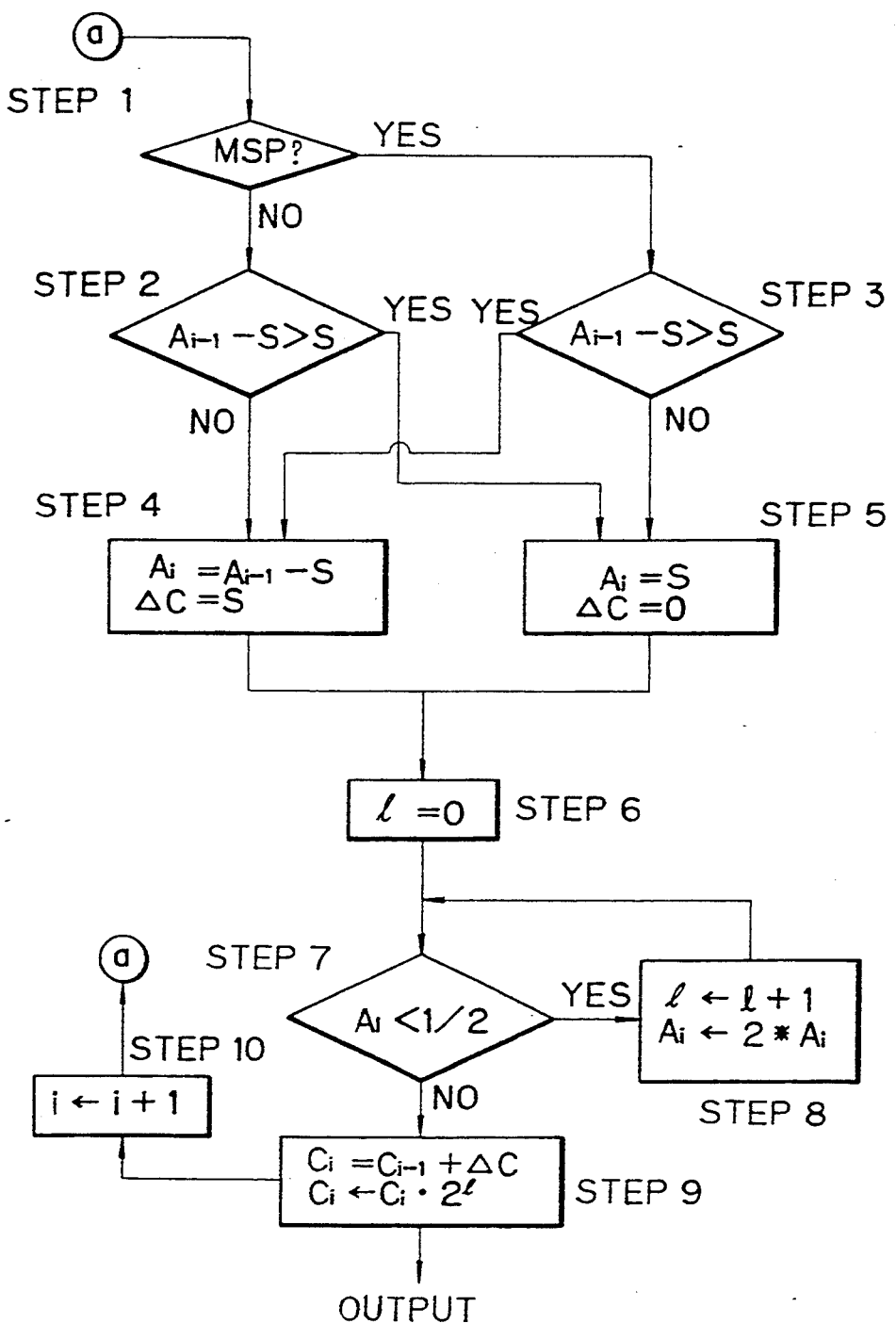
FIG. 4 is a flowchart showing a coding process.

FIG. 4 is a flowchart showing the procedures in the embodiment of this invention shown in FIG. 3.

At a step 1, whether the symbol inputted is the More Probability Symbol (MPS) or the Less Probability Symbol (LPS) is Judged. At steps 2 and 3, there is made a judgment as to whether or not the range $A_{i-1} - S$ allocated to the input symbol is larger than the range S allocated to the LPS on the basis of the judgment result.

More specifically, if judged as the LPS at the step 1, whether the range S allocated to the LPS is smaller than the range $A_{i-1} - S$ allocated to the MPS or not is judged at the step 2. If smaller than the range $A_{i-1} - S$, the operation proceeds to a step 5. Whereas if not, the operation moves to a step 4. If judged as the MPS at the step 1, whether the range $A_{i-1} - S$ allocated to the MPS is larger than the range S allocated to the LPS or not is judged at the step 3. If larger than the range S, the operation moves to the step 4. Whereas if not, the operation moves to a step 5.

When the range allocated to the MPS is larger than the range to the LPS wherein the input symbol is conceived as the MPS, and when the range allocated to the LPS is larger than the range to the MPS wherein the input symbol is the LPS, the minimum coordinates $C_i$ of the ranges $A_i$ for the respective inputs thereof are determined at the step 4.

When the range allocated to the MPS is smaller than the range to the LPS wherein the input symbol is the MPS, and when the range allocated to the LPS is smaller than the range to the MPS wherein the input symbol is LPS, the minimum coordinates $C_i$ of the ranges $A_i$ for the respective input symbols are determined at the step 5.

An initial value of the shift quantity l is set to 0 at a step 6.

At a step 7, whether each of the ranges $A_i$ determined at the step 4 or 5 is smaller than 0.5 or not is judged. If smaller than 0.5, the operation moves to a step 8. Whereas if larger than 0.5, the operation moves to a step 9.

The range $A_i$ is doubled, and the shift quantity l is increased by one ($+1$) in step 8. The judgment of the step 7 is made once again. This routine is repeated until the range $A_i$ exceeds 0.5.

For effecting the arithmetic operation of the code words, at a step 9 the differential coordinates $\Delta C$ are added to the minimum coordinates $C_{i-1}$ of the previous symbol range which have cumulatively been added. The minimum coordinates $C_i$ for the present symbol are thus obtained. Subsequently, the minimum coordinates $C_i$ are shifted by the shift quantity of bits. The range $A_i$ is added to the minimum coordinates $C_i$ shifted by l bits, thereby obtaining the maximum coordinates within the range $A_i$. When the l-bit-shifted portion of the minimum coordinates coincides with the superordinate of the maximum coordinates, the coincident bits are outputted as code words. If not, no bit is outputted.

The operation next moves to a step 10, wherein i is updated to $i+1$ for processing the next symbol. Then, the operation returns to the step 1.

Incidentally, when decoding on the receiving side, it is possible to know whether or not MPS/LPS is temporarily replaced on the transmitting side by comparing S with $A_{i-1} - S$. Decoding can correctly be carried out.

Next, the effects of the present invention will be quantitatively explained. Let r be the probability of occurrence of the LPS, and let S be the value of the fixed allocation. When $A=0.5$, an allocation ratio $r_s$ to the LPS is maximized such as: $r_s = 2S$. When $A=1$, the ratio is minimized such as: $r_s = S$.

When $r_s = 2S$, a mean code length $L_{2S}$ per symbol is given by:

$$L_{2S} = -(1-r)log(1-2S) - rlog2S$$

When $r_s = S$, a mean code length L is given by:

$$L = -(1-r)log(1-S) - rlogS$$

S, which is optimal to r given is obtained (in terms of minimizing the worst coding efficiency) by the value of S which satisfies $L_{2S} = L_s$.

Next, a range of the mean code length per symbol in the case of application of the present invention is the same as above when $S < \frac{1}{4}$. This range is, however, limited between Ls and 1 when $\frac{1}{4} \leq S \leq \frac{1}{2}$.

Figure 5:
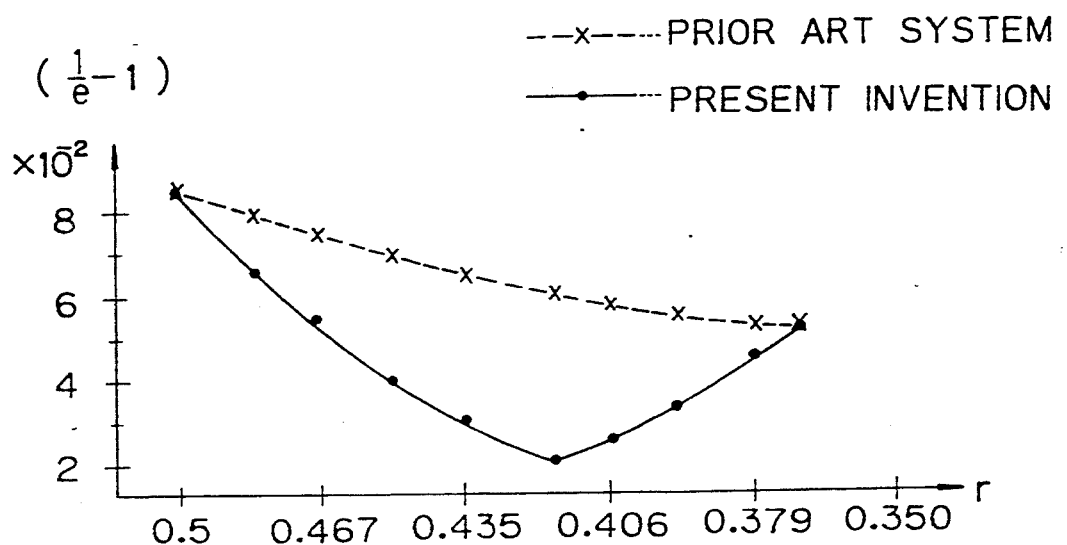
FIG. 5 is a graphic chart showing a coding efficiency in the embodiment of the invention.

FIG. 5 is a graphic chart of $1/(e-1)$ where e is the coding efficiency in this embodiment. It can be understood from FIG. 5 that the coding efficiency is improved by approximately 5% at the maximum.

Note that the embodiment discussed above has dealt with an example where normally MPS is taken on the upper side on the number line, while the LPS is taken on the lower side. Much the same effects are exhibited by adopting such a principle that the MPS and LPS are taken on the mutually reversed sides.

As discussed above, the present invention exhibits the following effects. The magnitudes of the regions allocated to the MPS and the LPS are set in the following manner. The region allocated to the MPS is invariably larger than the region allocated to the LPS. With this arrangement, the high coding efficiency can be obtained.

Although the illustrative embodiment of the present invention has been described in detail with reference to the accompanying drawings, it is to be understood that the present invention is not limited to that embodiment. Various changes or modifications may be effected therein by one skilled in the art without departing from the scope or spirit of the invention.

What is claimed is:

1. A system for coding an image signal as a symbol sequence having more probable symbols (MPSs) and less probable symbols (LPSs), the MPS exhibiting a higher probability of occurrence than the LPS, by establishing correspondence of a MPS and a LPS to predetermined ranges of a number line so as to use coordinates of the number line as code words for the sequence, said system comprising:

comparison means for comparing a first range allocated to the MPS and a second range allocated to the LPS to determine which range is larger;

changeover means for allocating the first range to the LPS and the second range to the MPS, if the first range is determined to be smaller than the second range by the comparison means; and means for providing code words on the basis of a range allocated to the symbol.

2. An apparatus for coding an image signal as a symbol sequence from a Markov information source, the sequence comprised of less probable symbols (LPSs) and more probable symbols (MPSs), said MPS exhibiting a probability of occurrence higher than a probability of occurrence of said LPS, by coding the symbol sequence according to a number line, said apparatus comprising:

memory storage means for storing the number line having a range which corresponds to said symbol sequence;

means for allocating a first range of said number line as a mapping interval for said MPSs;

means for allocating a second range of said number line as a mapping interval for said LPSs;

comparison means for comparing the first range to the second range to determine which range is larger;

changeover means for allocating said first range to the LPS and said second range to the MPS, if said first range is determined to be smaller than said second range; and means for providing code words on the basis of a range allocated to a symbol.

3. A method of coding an image signal as a symbol sequence from a Markov information source, the sequence comprised of less probable symbols (LPSs) and more probable symbols (MPSs), said MPS having a probability of occurrence higher than a probability of occurrence of said LPS, by coding the symbol sequence based on a number line, said method comprising the steps of:

storing, in a memory storage device, the number line having a range which corresponds to said symbol sequence;

allocating a first range of said number line as a mapping interval for said MPSs;

allocating a second range of said number line as a mapping interval for said LPSs;

comparing the first range and the second range to determine which range is larger;

allocating said first range to the LPS and said second range to the MPS, if said first range allocated to the MPS is determined to be smaller than said second range allocated to the LPS; and providing code words on the basis of a range allocated to the symbol sequence.

4. A system for coding an image symbol sequence having more probable symbols (MPSs) and less probable symbols (LPSs), the MPS exhibiting a higher probability of occurrence than the LPS, by establishing correspondence of a MPS and a LPS to predetermined ranges of a number line so as to use coordinates of the number line as code words for the sequence, said system comprising:

comparison means for comparing a first range allocated to a MPS and a second range allocated to a LPS to determine which range is larger;

changeover means for allocating the first range to the LPS and the second range to the MPS, if the comparison means determines that the first range is smaller than the second range; and coding means for encoding the symbol sequence to code words by using the range allocated to the symbol after the changeover operation.

5. An apparatus for coding a symbol sequence from a Markov information source, the sequence comprised of less probable symbols (LPSs) and more probable symbols (MPSs), said MPS exhibiting a probability of occurrence higher than a probability of occurrence of said LPS, by coding the symbol sequence according to a number line, said apparatus comprising:

memory storage means for storing the number line having a range which corresponds to said symbol sequence;

means for allocating a first range of said number line as a mapping interval for said MPSs;

means for allocating a second range of said number line as a mapping interval for said LPSs;

comparison means for comparing the first range and the second range to determine which range is larger;

changeover means for allocating said first range to the LPS and said second range to the MPS, if said first range is determined to be smaller than said second range by the comparison means; and coding means for encoding the symbol sequence to code words by using the range allocated to the symbol after the changeover operation.

6. A method of coding a symbol sequence from a Markov information source, the sequence comprised of less probable symbols (LPSs) and more probable symbols (MPSs), said MPS having a probability of occurrence higher than a probability of occurrence of said LPS, by coding the symbol sequence based on a number line, said method comprising the steps of:

storing, in a memory storage device, the number line having a range which corresponds to said symbol sequence;

allocating a first range as a mapping interval for said MPSs;

allocating a second range as a mapping interval for said LPSs;

comparing the first range and the second range to determine which of the ranges is larger;

allocating said first range to the LPS and said second range to the MPS, if said first range is determined to be smaller than said second range; and coding the input symbol sequence by using the range allocated to the input symbol sequence after the changeover operation.

7. A system for coding a symbol sequence into a code word that corresponds to a current mapping range of a number line, the sequence comprised of more probable symbols (MPSs) and less probable symbols (LPSs), the system comprising:

means for providing a range corresponding to the LPS and for storing a prior mapping range corresponding to the mapping range of the sequence prior to a new symbol of the sequence;

means for calculating the current mapping range and the code word in response to the new symbol based on a combination of the prior mapping range and a control signal; and means for providing the control signal such that it indicates a first state when the current mapping range for the MPS is greater than the current mapping range for LPS, and indicates a second state otherwise.

8. In a system for coding sequences of more probable symbols (MPSs) and less probable symbols (LPSs), a MPS having a higher probability of occurrence than a LPS, the system having means for providing a range corresponding to the LPS, means for providing a range corresponding to the MPS, and means for calculating a code word in response to a selected range and a new symbol, a comparison unit for comparing the range corresponding to the MPS and the range corresponding to the LPS, said unit outputting as the selected range the range that is the larger of the two ranges when the new symbol is a MPS, and outputting the smaller range of the two when the new symbol is a LPS.

9. The system for coding of claim 7, wherein if the control signal indicates the first state, the means for calculating provides the current mapping range and the code word corresponding to the new symbol being a MPS, when the new symbol is a MPS, and corresponding to the new symbol being a LPS, when the new symbol is a LPS; and wherein if the control signal indicates the second state, the means for calculating provides the current mapping range and the code word corresponding to the new symbol being a MPS, when the new symbol is a LPS, and corresponding to the new symbol being a LPS, when the new symbol is a MPS.

* * * * *